(12) United States Patent
Ulcar

(10) Patent No.: US 8,823,442 B1
(45) Date of Patent: *Sep. 2, 2014

(54) SYSTEM AND METHOD OF REDUCING MAGNITUDES OF KICK-BACK VOLTAGES IN A CIRCUIT THAT ALTERNATES A DIRECTION OF CURRENT FLOW THROUGH A LOAD

(71) Applicant: Marvell International Ltd., Hamilton (BM)

(72) Inventor: Talip Ulcar, San Francisco, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 13/741,516

(22) Filed: Jan. 15, 2013

Related U.S. Application Data

(63) Continuation of application No. 12/778,248, filed on May 12, 2010, now Pat. No. 8,354,874.

(60) Provisional application No. 61/178,696, filed on May 15, 2009.

(51) Int. Cl.
*H03K 17/687* (2006.01)

(52) U.S. Cl.
USPC ............ 327/427; 327/432; 327/433; 327/434

(58) Field of Classification Search
USPC .................. 327/108–112, 379, 389, 391; 326/22–27, 81–87
See application file for complete search history.

(56) References Cited

U.S. PATENT DOCUMENTS

| 6,856,178 B1 * | 2/2005 | Narayan ................. 327/108 |
| 7,199,613 B2 * | 4/2007 | Chauhan et al. ............ 326/81 |

* cited by examiner

*Primary Examiner* — Brandon S Cole

(57) ABSTRACT

A circuit is provided and includes current sources, switches, a control module, and capacitances. The current sources adjust current flowing through a load. Each of the switches activates a respective one of the current sources. Kick-back voltages are generated at inputs of the current sources in response to the current sources being turned ON. A control module generates control signals to change states of the switches to alternate a direction in which the current flows through the load. A first capacitance is connected between a first pair of the current sources and a second pair of the current sources. A second capacitance is connected between the first pair of the current sources and a reference terminal. A third capacitance connected between the second pair of the current sources and the reference terminal. The first capacitance, the second capacitance, and the third capacitance reduce magnitudes of the kick-back voltages.

22 Claims, 6 Drawing Sheets

SYSTEM AND METHOD OF REDUCING MAGNITUDES OF KICK-BACK VOLTAGES IN A CIRCUIT THAT ALTERNATES A DIRECTION OF CURRENT FLOW THROUGH A LOAD

CROSS-REFERENCE TO RELATED APPLICATIONS

This application is a continuation of U.S. patent application Ser. No. 12/778,248 (now U.S. Pat. No. 8,354,875) which claims the benefit of U.S. Provisional Application No. 61/178,696, filed on May 15, 2009. The disclosures of the above applications are incorporated herein by reference in their entirety.

FIELD

The present disclosure relates to Class B type circuits, and more particularly to biasing and control of Class B type circuits.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Circuits may be classified as type A and B. The classification of the circuit is based in part on a portion of the input signal cycle during which the circuit conducts.

In Class A type circuits, 100% of the input signal is used. Where efficiency is not a consideration, most small signal linear amplifiers are designed as Class A type circuits. While Class A type circuits are typically more linear and less complex than other circuit types, they are relatively inefficient.

Class B type circuits use 50% of the input signal. In most Class B type circuits, there are two output devices that conduct alternately during half cycles. Some distortion may occur in Class B type circuits. While distortion is usually worse at higher frequencies, distortion may also occur at lower frequencies due to kickback.

Referring now to FIG. 1, an exemplary Class B type circuit 10 is shown. The circuit 10 includes controllable current sources 12, 14, 16 and 18. During one half cycle, the current sources 12 and 18 supply current in a first direction across a load 20. During a second half cycle, the current sources 14 and 16 provide current across the load 20 in an opposite direction.

Class B type circuits such as current digital to analog converters (DACs) do not work in differential arrangements. As a result, a large kick-back is usually seen at a control terminal of current sources in Class B type circuits if there is not enough voltage headroom to use cascode devices, which can cause distortion.

SUMMARY

A circuit is provided and includes current sources, switches, a control module, and capacitances. The current sources are configured to adjust current flowing through a load. Each of the switches is configured to activate a respective one of the current sources. Kick-back voltages are generated at inputs of the current sources in response to the current sources being turned ON. A control module is configured to generate control signals to change states of the switches to alternate a direction in which the current flows through the load. A first capacitance is connected between (i) a first pair of the current sources and (ii) a second pair of the current sources. A second capacitance is connected between (i) the first pair of the current sources and (ii) a reference terminal. A third capacitance connected between (i) the second pair of the current sources and (ii) the reference terminal. The first capacitance, the second capacitance, and the third capacitance reduce magnitudes of the kick-back voltages.

In other features, a method is provided and includes adjusting current flowing through a load via current sources. Control signals are generated to change states of switches to alternate a direction in which a current flows through the load. Kick-back voltages are generated at inputs of the current sources in response to the current sources being turned ON. Each of the switches is configured to activate a respective one of the current sources. The method further includes alternating current coupling, via a first capacitance, a first pair of the current sources to a second pair of the current sources. The first capacitance is connected between (i) the first pair of the current sources and (ii) the second pair of the current sources. Current is directed, via a second capacitance, away from the first pair of the current sources and to a reference terminal. Current is directed, via a third capacitance, away from the second pair of the current sources and to the reference terminal. Magnitudes of the kick-back voltages are reduced via the first capacitance, the second capacitance, and the third capacitance.

A circuit includes a first current source, a second current source, a third current source and a fourth current source. A load includes a first terminal connected to a first node between the first current source and the second current source and a second terminal connected to a second node between the third current source and the fourth current source. A bias control module includes a first output configured to output a first bias signal to the first and fourth current sources and a second output configured to provide a second bias signal to the second and third current sources. A capacitance is connected to the first and second outputs of the bias control module.

In other features, the bias control module includes a first bias circuit and a second bias circuit. A first switch and the first current source are connected between a voltage supply and the first node. A second switch and the second current source are connected between the first node and a reference potential. A third switch and the third current source are connected between the voltage supply and the second node. A fourth switch and the fourth current source are connected between the second node and the reference potential.

A circuit includes a Class B type circuit including a first input, a second input, a first output and a second output. A bias control module includes a first output configured to output a first bias signal to the first input. A second output is configured to provide a second bias signal to the second input. A capacitance is connected to the first output and the second output of the bias control module.

In other features, a load is connected across the first output and the second output of the Class B type circuit. The bias control module includes a first bias circuit and a second bias circuit.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

DESCRIPTION

Figure 1:
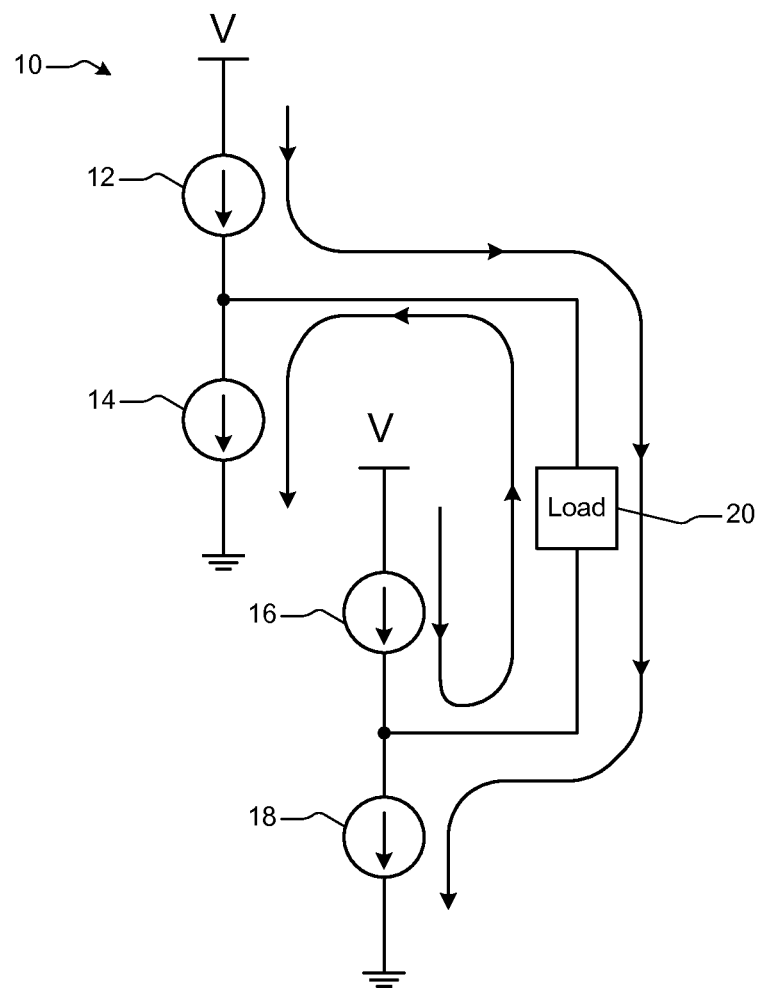
FIG. 1 is a functional block diagram and electrical schematic for a Class B type circuit according to the prior art.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical OR. It should be understood that steps within a method may be executed in different order without altering the principles of the present disclosure.

As used herein, the term module may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Figure 2:
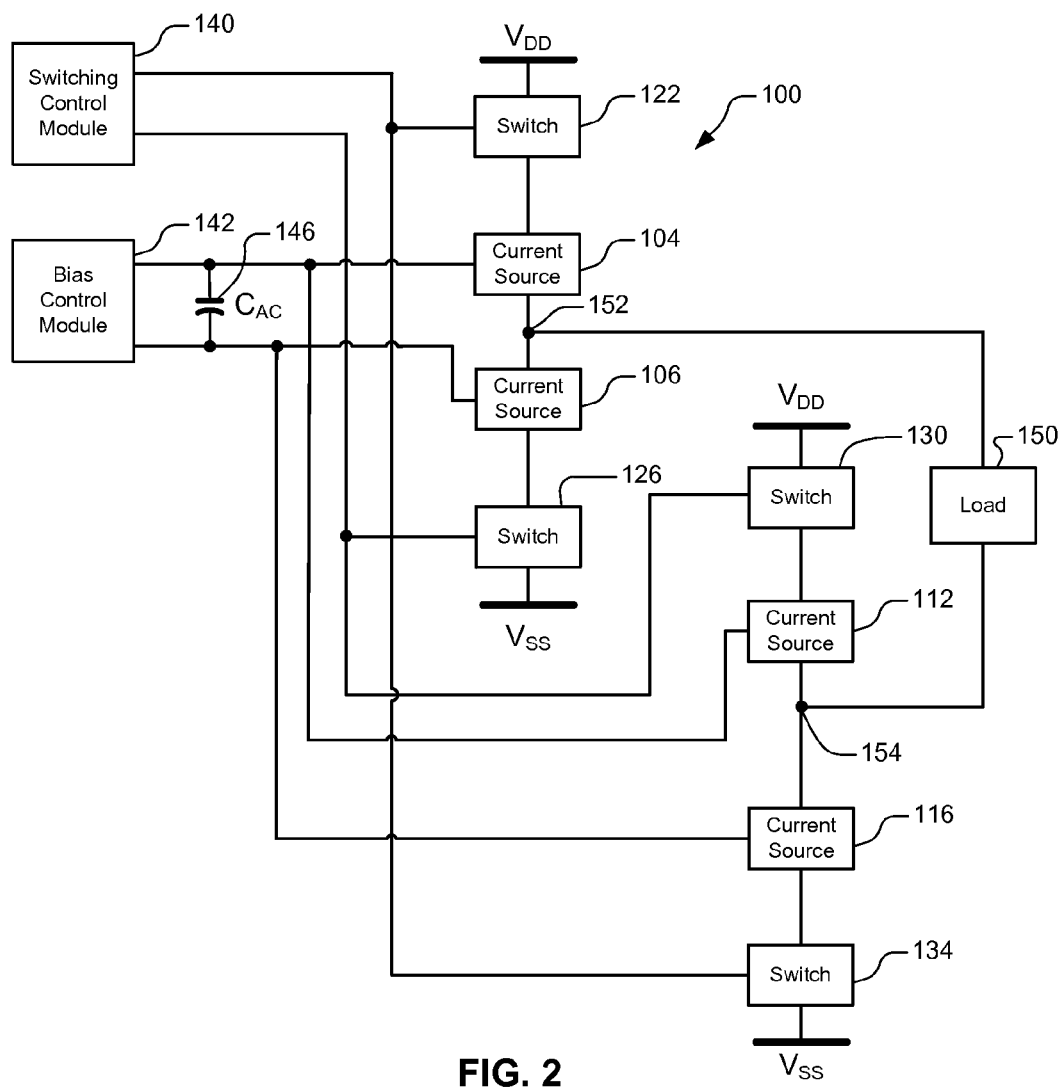
FIG. 2 is a functional block diagram and electrical schematic of a Class B type circuit according to the present disclosure.

Referring now to FIG. 2, a Class B type circuit 100 according to the present disclosure is shown. The circuit 100 includes current sources 104, 106, 112 and 116. The circuit 100 further includes switches 122, 126, 130 and 134 that switch the current sources 104, 106, 112 and 116, respectively, on and off to alternate a direction of the current across a load 150.

The circuit 100 includes a switching control module 140 that controls states of the switches 122, 126, 130 and 134. A bias control module 142 generates control signals for biasing control terminals of transistors associated with the current sources 104, 106, 112 and 116.

According to the present disclosure, AC coupling is provided between first and second outputs of the bias control module 142 to reduce kickback. More particularly, an AC coupling capacitor 146 is connected across first and second outputs of the bias control module 142.

A load 150 has a first terminal connected to a first node 152 between the current sources 104, 106 and has a second terminal connected to a second node 154 between the current sources 112, 116. The circuit 100 provides current across the load 150 in a first direction during a first-half cycle and in an opposite direction during a second-half cycle.

In more detail, the switch 122 and the current source 104 are connected between a voltage supply $V_{DD}$ and the first node 152. The current source 106 and the switch 126 are connected between the first node 152 and a reference potential $V_{SS}$ such as ground. The switch 130 and the current source 112 are connected between the voltage supply $V_{DD}$ and the second node 154. The current source 116 and the switch 134 are connected between the second node 154 and the reference potential $V_{SS}$.

In use, the current sources 104, 106, 112 and 116 are constantly biased during operation. The switches 122 and 134 are selectively turned on and off while the switches 126 and 130 are off and vice versa. In other words, current flows during one half cycle from the switch 122 and the current source 104 to the load 150 and to the current source 116 and the switch 134. Subsequently during the next half cycle, current flows from the switch 130 and the current source 112 to the load 150 and to the current source 106 and the switch 126.

In class-B type circuits, when the switches are turned on or off to generate current in one direction, the switches that control the supply of current in the opposite direction are always off. For example in FIG. 2, switches 122 and 134 are turned on and off to generate or stop current flow in first direction while switches 126 and 130 remain off. When switches 126 and 130 are active (turning on/off together), switches 122 and 134 remain off.

During operation, kickback at control terminals of the current sources 104, 106, 112 and 116 tends to occur. Kickback at the current source 104 is approximately opposite in magnitude to that experienced at the current source 116. A similar situation exists for current sources 106 and 112 when the switches 126 and 130 transition from on to off, or from off to on. Placement of the AC coupling capacitor 146 across the control terminals of the current sources 104 and 116 and the control terminals of the current sources 106 and 112 tends to reduce distortion by canceling the kickback.

Figure 3:
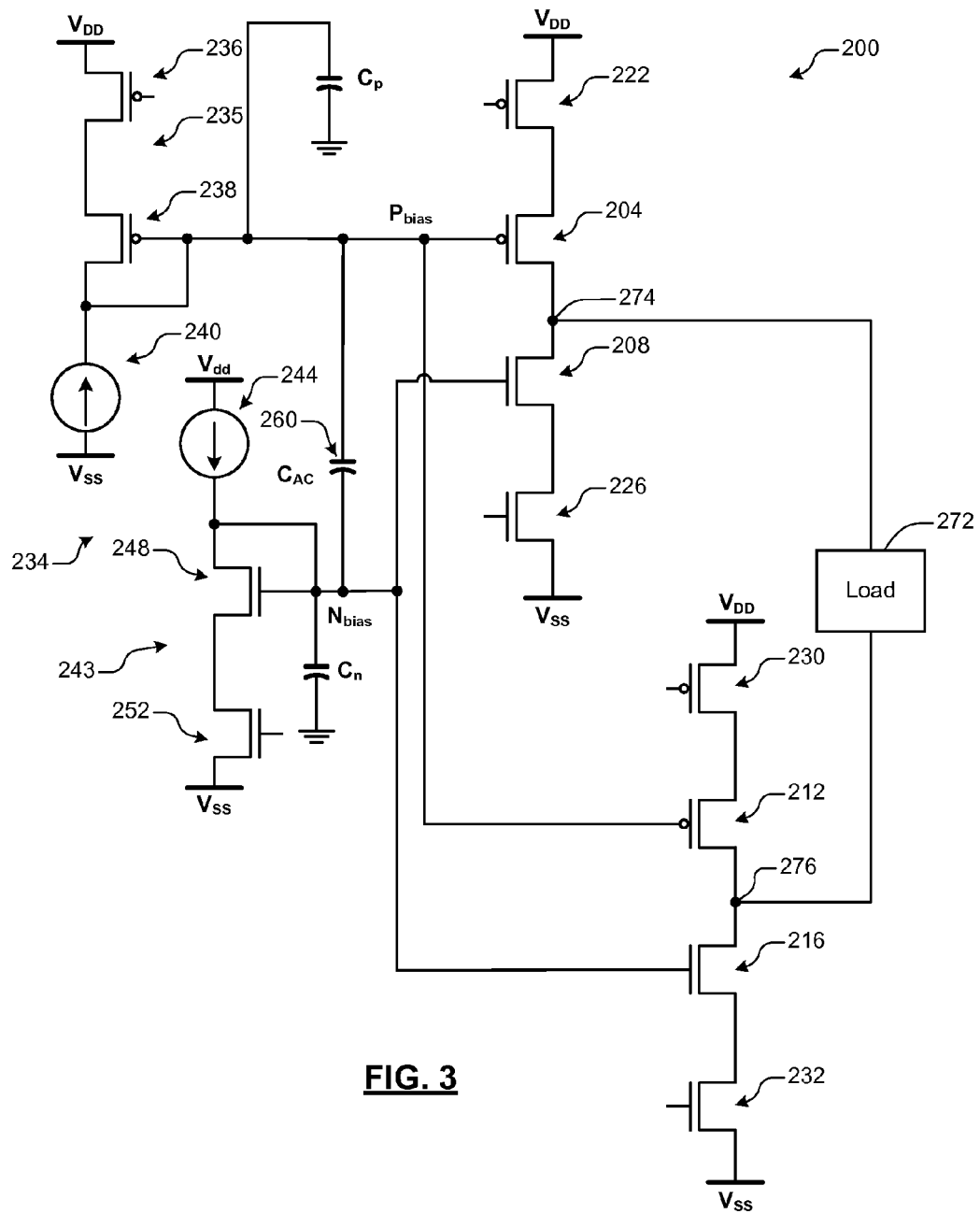
FIG. 3 is a functional block diagram and electrical schematic of another Class B type circuit according to the present disclosure.

Referring now to FIG. 3, another Class B type circuit 200 according to the present disclosure is shown. The circuit 200 includes current sources 204, 208, 212 and 216. The circuit 200 further includes switches 222, 226, 230 and 232. While the switching control module is omitted in FIG. 3, the switching control module may be provided to control states of the switches 222, 226, 230 and 232.

A bias control module 234 includes a first biasing circuit 235 and a second biasing circuit 243. The first biasing circuit 235 generates control signals for biasing control terminals of transistors of the current sources 204 and 212. The second biasing circuit 243 generates control signals for biasing control terminals of transistors of the current sources 208 and 216.

The first biasing circuit 235 includes a first transistor 236, a second transistor 238 and a current source 240. A first terminal of the transistor 236 is connected to the voltage supply $V_{DD}$. A second terminal of the transistor 236 is connected to a first terminal of the second transistor 238. A second terminal of the transistor 238 is connected to a current source 240 and to a control terminal of the second transistor 238. The control terminal of the second transistor 238 supplies a first bias signal to control terminals of transistors of the current sources 204 and 212.

The second biasing circuit 243 includes a first transistor 252, a second transistor 248 and a current source 244. A second terminal of the first transistor 252 is connected to the reference potential $V_{SS}$. A first terminal of the first transistor 252 is connected to a second terminal of the second transistor 248. A first terminal of the second transistor 248 is connected to the current source 244 and to a control terminal of the second transistor 248. The control terminal of the second transistor 248 supplies a second bias signal to control terminals of transistors of the current sources 208 and 216.

AC coupling is provided between outputs of the bias control module 234 to reduce kickback according to the present disclosure. More particularly, AC coupling capacitor 260 is connected across first and second outputs of the bias control module 234. A load 272 is connected to a first node 274 between the current sources 204 and 208 and to a second node 276 between the current sources 212 and 216. The circuit 200 provides current across the load 272 in a first direction during a first-half cycle and in an opposite direction during a second-half cycle.

In more detail, the switch 222 and the current source 204 are connected between a voltage supply $V_{DD}$ and the first node 274. The current source 208 and the switch 226 are connected between the first node 274 and a reference potential $V_{SS}$. The switch 230 and the current source 212 are connected between the voltage supply $V_{DD}$ and the second node 276. The current source 216 and the switch 232 are connected between the second node 276 and the reference potential $V_{SS}$.

Parasitic capacitance $C_p$ may be present at the control terminal of the second transistor 238 of the first biasing circuit 235. Parasitic capacitance $C_n$ may also be present at the control terminal of the second transistor 248 of the second biasing circuit 243.

In use, the current sources 204, 208, 212 and 216 are constantly biased during operation. The switches 222 and 232 are selectively turned on and off while the switches 226 and 230 remain off and vice versa. In other words, current flows during one half cycle from the switch 222 and the current source 204 to the load 272 and to the current source 216 and the switch 232. Subsequently during the next half cycle, current flows from the switch 230 and the current source 212 to the load 272 and to the current source 208 and the switch 226. When creating a sinusoidal or other type of output in class-B type circuits, a first half cycle is generated by sequentially turning on/off the switches that control current in one direction while keeping the switches that control current in the opposite direction off.

As a result of the switches 222 and 226 and 230 and 232 being switched in the alternating pattern described above and below, kickback experienced at control terminals of the current sources 204 and 216 and 208 and 212 occurs, respectively. The kickback at the current source 204 is approximately opposite in magnitude to that experienced at the control terminals of the current source 216. The kickback at the current source 208 is approximately opposite in magnitude to that experienced at the control terminals of the current source 212. As a result, placement of the AC coupling capacitor 260 across the control terminals of the current sources 204 and 216 and the control terminals of the current sources 208 and 212 tends to improve distortion by canceling the kickback.

In some implementations, the transistors 204, 212, 222, 230, 236 and 238 are P-type metal oxide semiconductor field effect transistors (MOSFET). In some implementations, the transistors 208, 216, 226, 232, 248 and 252 are N-type MOSFET transistors.

In class-B type push-pull circuits such as DACs, kick-back at the P-type current source bias node (designated as P bias in FIG. 3) is opposite to kick-back at N type current source bias node (designated as $N_{bias}$ in FIG. 3). The amplitude of kick-back at the P-type current sources is $K_p$. The amplitude of kick-back at the N-type current sources is $(-K_n)$, where $K_p$ and $K_n$ > 0. Using an AC-coupling capacitor ($C_{bias}$), the kick-back at P-type current sources can be reduced to:

$$|K_p| - \left(\frac{C_{bias}}{C_{bias} + C_p}\right) * |K_n|,$$

where $C_p$ is the parasitic capacitance from the gate of P-type current sources to the supply. The same is true for N-type current sources, where kick-back is reduced to:

$$|K_n| - \left(\frac{C_{bias}}{C_{bias} + C_n}\right) * |K_p|,$$

where $C_n$ is the parasitic capacitance from gates of N-type current sources to the ground.

As can be appreciated, the present disclosure reduces kickback and distortion utilizing AC coupling. While it is anticipated that the AC coupling described herein may provide approximately 10 dB of improvement in distortion, other applications may experience more or less improvement. The load can be any type of impedance including resistors, capacitors, inductors and combinations thereof.

Figure 4:
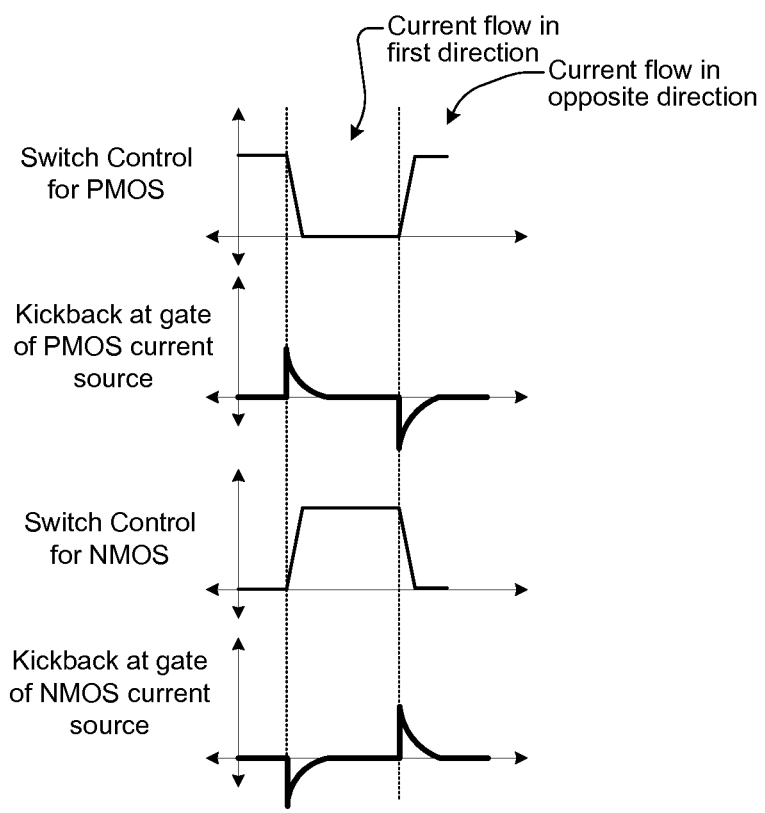
FIG. 4 is a graph showing switch control signals and kickback signals.

Referring now to FIG. 4, switch control signals and kickback signals are shown. When the switch control signals for the PMOS transistor 222 goes low and the NMOS transistor 232 goes high, there is kickback at the gate of the PMOS transistor 204 and the NMOS transistor 216. When the switch control signals for the PMOS transistor 230 goes high and the NMOS transistor 226 goes low, there is kickback at the gate of the PMOS transistor 212 and the NMOS transistor 208.

Figure 5:
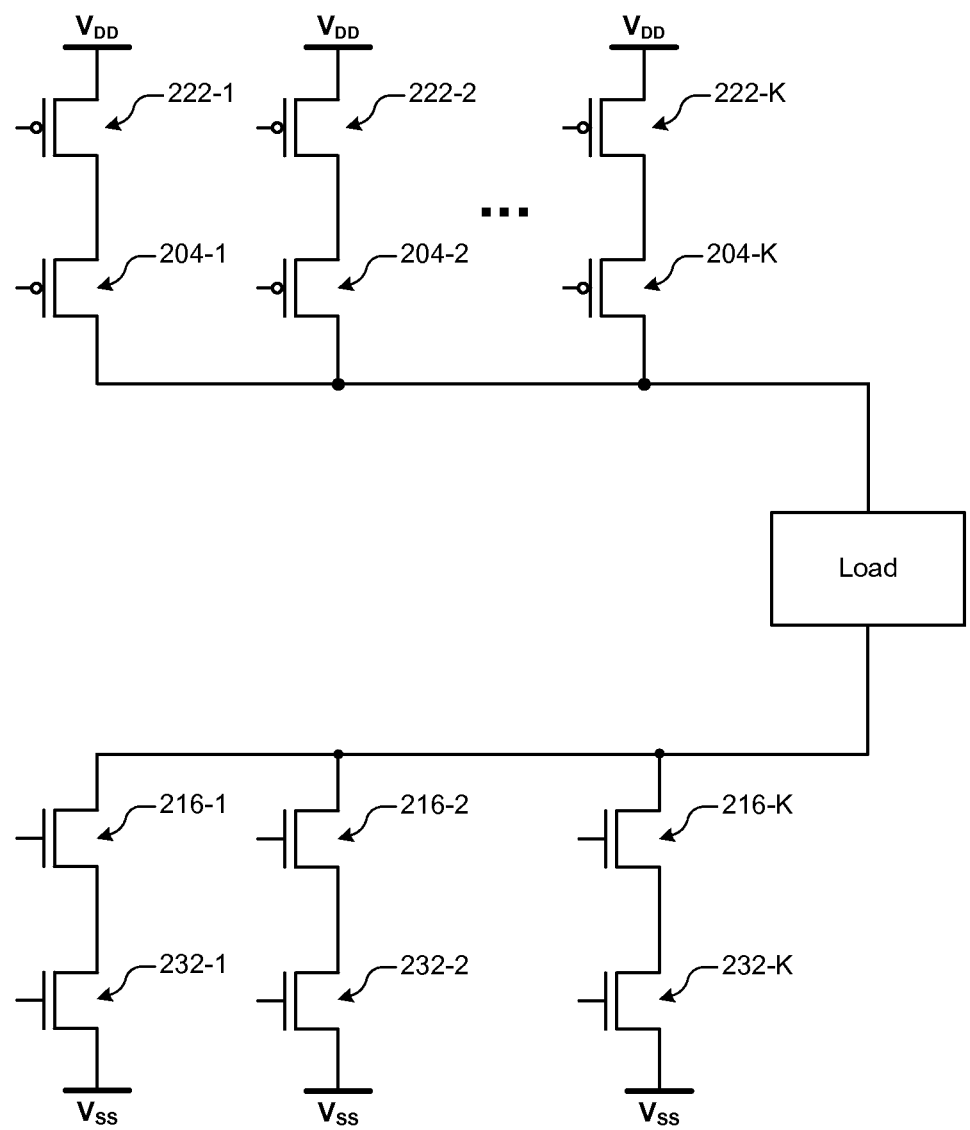
FIG. 5 is a functional block diagram and electrical schematic of a portion of another Class B type circuit according to the present disclosure.

Referring now to FIG. 5, in some implementations the transistors may include multiple transistors. For example, the transistors 204 and 222 in FIG. 3 may include transistors 204-1, 204-2, . . . , and 204-K and 222-1, 222-2, . . . , and 222-K, respectively. K is an integer greater than one. Likewise, the transistors 216 and 232 in FIG. 3 may include transistors 216-1, 216-2, . . . , and 216-K and 232-1, 232-2, . . . , and 232-K, respectively. The transistors 208 and 226 and 212 and 230 may be implemented in an analogous manner.

Figure 6:
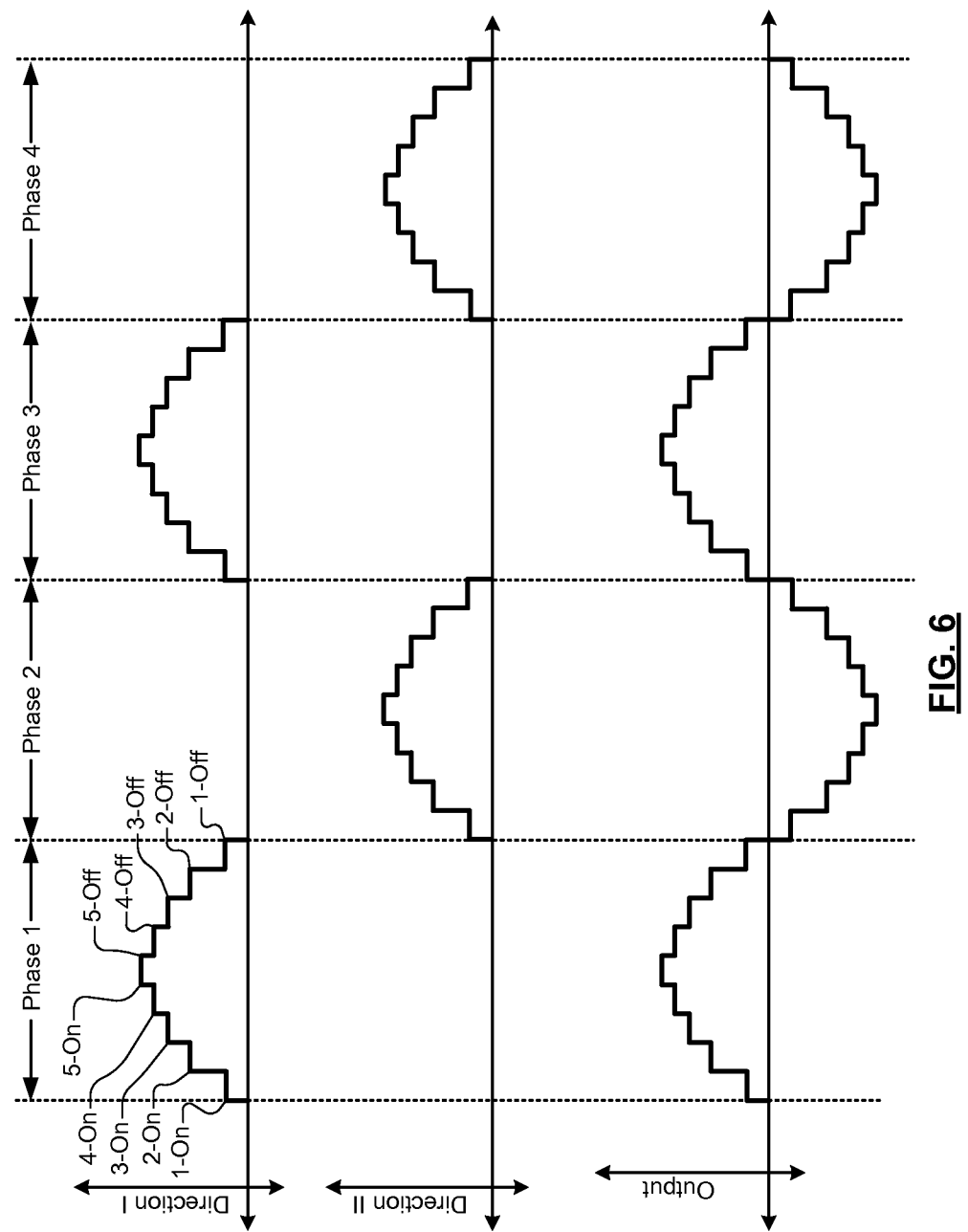
FIG. 6 includes graphs illustrating current output.

Referring now to FIG. 6, graphs illustrating current output to generate a sinusoidal waveform are shown. In this example implementation, K=5. The current sources (204, 208, 212 and 216) are biased on. The switches 226 and 230 are off during Phase 1 and Phase 3. The switches 222 and 232 are off during Phase 2 and 4.

During Phase 1, switches 222-1, 222-2, . . . , 222-5 and 232-1, 232-2, . . . , and 232-5 are sequentially turned on and then sequentially turned off. For example, the switches can be turned off in reverse order although other approaches may be used in a particular application. This approach generates a stepped current waveform (having a sinusoidal shape) in a first direction during Phases 1 and 3 as shown. The other switches 230 and 226 are operated in a similar manner during Phases 2 and 4 to generate a stepped current waveform (having a sinusoidal shape) in a second direction.

As can be appreciated, the output sees a generally sinusoidal output as shown. Other output waveforms may be generated, different timing may be used and/or additional or fewer transistors can be used in other implementations.

The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A circuit comprising:
a plurality of current sources configured to adjust current flowing through a load;
a plurality of switches, wherein each of the plurality of switches is configured to activate a respective one of the plurality of current sources, and wherein kick-back voltages are generated at inputs of the plurality of current sources in response to the plurality of current sources being turned ON;
a control module configured to generate control signals to change states of the plurality of switches to alternate a direction in which the current flows through the load;
a first capacitance connected between (i) a first pair of the plurality of current sources and (ii) a second pair of the plurality of current sources;
a second capacitance connected between (i) the first pair of the plurality of current sources and (ii) a ground reference terminal; and
a third capacitance connected between (i) the second pair of the plurality of current sources and (ii) the ground reference terminal,
wherein the first capacitance, the second capacitance, and the third capacitance reduce magnitudes of the kick-back voltages.

2. The circuit of claim 1, wherein:
the control module is configured to receive an input signal;
the input signal comprises a plurality of cycles;
each of the plurality of cycles comprises a first-half cycle and a second-half cycle; and
the control module generates the control signals such that the current flows through the load in (i) a first direction during the first-half cycles of the plurality of cycles, and (ii) a second direction during the second-half cycles of the plurality of cycles.

3. The circuit of claim 2, wherein:
the first pair of the plurality of the current sources comprises a first current source and a second current source;
the second pair of the plurality of the current sources comprises a third current source and a fourth current source;
the control module generates a first control signal to activate the first current source and the fourth current source during the first-half cycles of the plurality of cycles; and
the control module generates a second control signal to activate the second current source and the third current source during the second-half cycles of the plurality of cycles.

4. The circuit of claim 3, further comprising:
a first bias circuit comprising the second capacitance and a first output, wherein
the first bias circuit is configured to output a first bias signal at the first output of the first bias circuit,
the second capacitance is configured to direct current from the first output of the first bias circuit to the reference terminal, and
the first current source and the second current source are configured to supply the current flowing through the load in response to the first bias signal; and
a second bias circuit comprising the third capacitance and a second output, wherein
the second bias circuit is configured to output a second bias signal at the second output of the second bias circuit,
the third capacitance is configured to direct current from the second output of the second bias circuit to the reference terminal, and
the third current source and the fourth current source are configured to adjust the current flowing through the load in response to the second bias signal.

5. The circuit of claim 3, further comprising:
a first bias circuit comprising
a first transistor,
a second transistor comprising a control terminal, wherein the control terminal of the second transistor is connected to the first pair of the plurality of current sources, and
a fifth current source connected in series with the first transistor and the second transistor; and
a second bias circuit comprising
a sixth current source,
a third transistor comprising a control terminal, wherein the control terminal of the third transistor is connected to the second pair of the plurality of current sources, and
a fourth transistor connected in series with the sixth current source and the third transistor.

6. The circuit of claim 5, wherein:
the second transistor comprises an input terminal and an output terminal;
the input terminal of the second transistor is connected to the first transistor;
the fifth current source comprises an output;
the output of the fifth current source is connected to (i) the output terminal of the second transistor, and (ii) the control terminal of the second transistor; and
the fifth current source is configured to output current to the control terminal of the second transistor.

7. The circuit of claim 5, wherein:
the third transistor comprises an input terminal and an output terminal;
the sixth current source is configured to output current to (i) the input terminal of the third transistor, and (ii) the control terminal of the third transistor; and
the output of the third transistor is connected to the fourth transistor.

8. The circuit of claim 5, wherein:
the first capacitance and the second capacitance are connected to (i) the control terminal of the second transistor, and (ii) an output of the fifth current source; and
the first capacitance and the third capacitance are connected to (1) an output of the sixth current source, and (ii) the control terminal of the third transistor.

9. The circuit of claim 1, wherein:
the plurality of switches comprise a first switch, a second switch, a third switch, and a fourth switch;
the plurality of current sources comprise a first current source, a second current source, a third current source, and a fourth current source;
an output of the first current source and an input of the third current source are connected to a first terminal of the load;
an output of the second current source and an input of the fourth current source are connected to a second terminal of the load;
the first current source and the third current source are connected between the first switch and the second switch; and
the second current source and the fourth current source are connected between the third switch and the fourth switch.

10. The circuit of claim 9, wherein:
each of the first switch, the third switch, the first current source, and the second current source is a P-type metal oxide semiconductor field effect transistor; and each of the second switch, the fourth switch, the third current source, and the fourth current source is a N-type metal oxide semiconductor field effect transistor.

11. The circuit of claim 1, wherein:
the plurality of current sources comprise a first current source, a second current source, a third current source, and a fourth current source;
the first current source is configured to receive a first bias signal and is connected between a voltage supply and a first node;
the second current source is configured to receive a second bias signal and is connected between the first node and a second reference potential;
the third current source is configured to receive the second bias signal and is connected between the voltage supply and a second node; and
the fourth current source is configured to receive the first bias signal and is connected between the second node and the second reference potential.

12. The circuit of claim 1, wherein the second capacitance is not connected between (i) the first pair of the plurality of current sources and (ii) an output terminal of the plurality of current sources.

13. A method comprising:
adjusting current flowing through a load via a plurality of current sources;
generating control signals to change states of a plurality of switches to alternate a direction in which a current flows through the load;
generating kick-back voltages at inputs of the plurality of current sources in response to the plurality of current sources being turned ON, wherein each of the plurality of switches is configured to activate a respective one of the plurality of current sources;
alternating current coupling, via a first capacitance, a first pair of the plurality of current sources to a second pair of the plurality of current sources, wherein the first capacitance is connected between (i) the first pair of the plurality of current sources and (ii) the second pair of the plurality of current sources;
directing current, via a second capacitance, away from the first pair of the plurality of current sources and to a ground reference terminal;
directing current, via a third capacitance, away from the second pair of the plurality of current sources and to the ground reference terminal; and
reducing magnitudes of the kick-back voltages via the first capacitance, the second capacitance, and the third capacitance.

14. The method of claim 13, further comprising receiving an input signal, wherein:
the input signal comprising a plurality of cycles;
each of the plurality of cycles comprises a first-half cycle and a second-half cycle; and
the control signals are generated such that the current flows through the load in (i) a first direction during the first-half cycles of the plurality of cycles, and (ii) a second direction during the second-half cycles of the plurality of cycles.

15. The method of claim 14, comprising:
generating a first control signal to activate a first current source and a fourth current source during the first-half cycles of the plurality of cycles, wherein the first pair of the plurality of the current sources comprises the first current source and a second current source, and wherein the second pair of the plurality of the current sources comprises a third current source and the fourth current source; and
generating a second control signal to activate the second current source and the third current source during the second-half cycles of the plurality of cycles.

16. The method of claim 15, further comprising:
outputting a first bias signal via a first bias circuit, wherein the first bias circuit comprises the second capacitance and a first output;
directing current, via the second capacitance, from the first output of the first bias circuit to the reference terminal;
supplying, via the first current source and the second current source, the current flowing through the load in response to the first bias signal;
outputting a second bias signal, via a second bias circuit, wherein the second bias circuit comprises the third capacitance and a second output;
directing current, via the third capacitance, from the second output of the second bias circuit to the reference terminal; and
adjusting, via the third current source and the fourth current source, the current flowing through the load in response to the second bias signal.

17. A method comprising:
adjusting current flowing through a load via a plurality of current sources;
generating a plurality of control signals to change states of a plurality of switches to alternate a direction in which a current flows through the load;
generating kick-back voltages at inputs of the plurality of current sources in response to the plurality of current sources being turned ON, wherein each of the plurality of switches is configured to activate a respective one of the plurality of current sources;
alternating current coupling, via a first capacitance, a first pair of the plurality of current sources to a second pair of the plurality of current sources, wherein the first capacitance is connected between (i) the first pair of the plurality of current sources and (ii) the second pair of the plurality of current sources;
directing current, via a second capacitance, away from the first pair of the plurality of current sources and to a reference terminal;
directing current, via a third capacitance, away from the second pair of the plurality of current sources and to the reference terminal;
reducing magnitudes of the kick-back voltages via the first capacitance, the second capacitance, and the third capacitance;
receiving an input signal, wherein
the input signal comprising a plurality of cycles,
each of the plurality of cycles comprises a first-half cycle and a second-half cycle,
the control signals are generated such that the current flows through the load in (i) a first direction during the first-half cycles of the plurality of cycles, and (ii) a second direction during the second-half cycles of the plurality of cycles, and
the generating of the plurality of control signals includes
generating a first control signal to activate a first current source and a fourth current source during the first-half cycles of the plurality of cycles, wherein the first pair of the plurality of the current sources comprises the first current source and a second current source, and wherein the second pair of the plurality of the current sources comprises a third current source and the fourth current source, and
generating a second control signal to activate the second current source and the third current source during the second-half cycles of the plurality of cycles;
generating a first bias signal via a first pair of transistors;
in response to the first bias signal, controlling the current through the load and provided from the first pair of the plurality of current sources; and
supplying current from a fifth current source to the first pair of the plurality of current sources, wherein the fifth current source is connected in series with the first pair of transistors.

18. The method of claim 13, wherein the second capacitance is not connected between (i) the first pair of the plurality of current sources and (ii) an output terminal of the plurality of current sources.

19. A circuit comprising:
a plurality of current sources configured to adjust current flowing through a load;
a plurality of switches, wherein each of the plurality of switches is configured to activate a respective one of the plurality of current sources, and wherein kick-back voltages are generated at inputs of the plurality of current sources in response to the plurality of current sources being turned ON;
a control module configured to generate control signals to change states of the plurality of switches to alternate a direction in which the current flows through the load;
a first capacitance connected between (i) a first pair of the plurality of current sources and (ii) a second pair of the plurality of current sources;
a second capacitance connected between (i) the first pair of the plurality of current sources and (ii) a reference terminal, wherein a first kick-back voltage is generated at the first pair of the plurality of current sources in response to the first pair of the plurality of current sources being turned ON, and wherein a first magnitude of the first kick-back voltage is based on the first capacitance and the second capacitance; and
a third capacitance connected between (i) the second pair of the plurality of current sources and (ii) the reference terminal,
wherein
the first capacitance, the second capacitance, and the third capacitance reduce magnitudes of the kick-back voltages,
a second kick-back voltage is generated at the second pair of the plurality of current sources in response to the second pair of the plurality of current sources being turned ON,
a second magnitude of the second kick-back voltage is based on the first capacitance and the third capacitance, and
the second magnitude of the second kick-back voltage has an opposite polarity than the first magnitude of the first kick-back voltage.

20. A circuit comprising:
a plurality of current sources configured to adjust current flowing through a load, wherein
the plurality of current sources comprise a first current source, a second current source, a third current source, and a fourth current source,
an output of the first current source and an input of the third current source are connected to a first terminal of the load, and
an output of the second current source and an input of the fourth current source are connected to a second terminal of the load;
a plurality of switches comprising a first switch, a second switch, a third switch, and a fourth switch, wherein
each of the plurality of switches is configured to activate a respective one of the plurality of current sources,
kick-back voltages are generated at inputs of the plurality of current sources in response to the plurality of current sources being turned ON,
the first current source and the third current source are connected between the first switch and the second switch, and
the second current source and the fourth current source are connected between the third switch and the fourth switch;
a control module configured to generate control signals to change states of the plurality of switches to alternate a direction in which the current flows through the load;
a first capacitance connected between (0 a first pair of the plurality of current sources and (ii) a second pair of the plurality of current sources;
a second capacitance connected between (i) the first pair of the plurality of current sources and (ii) a reference terminal; and
a third capacitance connected between (i) the second pair of the plurality of current sources and (ii) the reference terminal,
wherein
the first capacitance, the second capacitance, and the third capacitance reduce magnitudes of the kick-back voltages,
a control terminal of the first current source and a control terminal of the second current source are both connected to the first capacitance and the second capacitance,
the control terminal of the first current source and the control terminal of the second current source are inverting inputs,
a control terminal of the third current source and a control terminal of the fourth current source are both connected to the first capacitance and the third capacitance, and
the control terminal of the third current source and the control terminal of the fourth current source are non-inverting inputs.

21. A circuit comprising:
a plurality of current sources configured to adjust current flowing through a load;
a plurality of switches, wherein each of the plurality of switches is configured to activate a respective one of the plurality of current sources, and wherein kick-back voltages are generated at inputs of the plurality of current sources in response to the plurality of current sources being turned ON;
a control module configured to generate control signals to change states of the plurality of switches to alternate a direction in which the current flows through the load;
a first capacitance connected between (i) a first pair of the plurality of current sources and (ii) a second pair of the plurality of current sources;
a second capacitance connected between (i) the first pair of the plurality of current sources and (ii) a reference terminal;
a third capacitance connected between (i) the second pair of the plurality of current sources and (ii) the reference terminal, wherein the first capacitance, the second capacitance, and the third capacitance reduce magnitudes of the kick-back voltages;

a first bias circuit configured to generate a first bias signal to bias control terminals of the first pair of the plurality of current sources;

a second bias circuit configured to generate a second bias signal to bias control terminals of the second pair of the plurality of current sources;

a first terminal connected between (i) the first bias circuit, and (ii) the first pair of the plurality of current sources, wherein a first kick-back voltage is generated at the first terminal based on the first capacitance and the second capacitance; and a second terminal connected between (i) the second bias circuit, and (ii) the second pair of the plurality of current sources, wherein a second kick-back voltage is generated at the second terminal based on the first capacitance and the third capacitance.

22. The method of claim 17, further comprising:

supplying current from a sixth current source to the second pair of the plurality of current sources; and supplying current from the sixth current source to a second pair of transistors, wherein the sixth current source and the second pair of transistors are connected in series.

* * * * *